(12) United States Patent
Eiger et al.

(10) Patent No.: US 7,037,114 B1
(45) Date of Patent: May 2, 2006

(54) LOW PROFILE ELECTRO-MECHANICAL CONNECTOR

(75) Inventors: Jay Eiger, Eastlake, OH (US); Matthew Tarler, Westlake, OH (US)

(73) Assignee: Cleveland Medical Devices Inc., Cleveland, OH (US)

( * ) Notice: Subject to any disclaimer, the term of this patent is extended or adjusted under 35 U.S.C. 154(b) by 0 days.

(21) Appl. No.: 11/040,649

(22) Filed: Jan. 21, 2005

(51) Int. Cl.
 *H01R 12/00* (2006.01)
(52) U.S. Cl. .......................................... 439/67; 439/77
(58) Field of Classification Search .................. 439/67, 439/632, 417, 492–496, 77, 404, 629–630, 439/635–638, 799
See application file for complete search history.

(56) References Cited

U.S. PATENT DOCUMENTS

| | | | |
|---|---|---|---|
| 4,203,643 A | | 5/1980 | Krolak et al. |
| 4,717,345 A | * | 1/1988 | Gordon et al. ................ 439/67 |
| 5,069,625 A | * | 12/1991 | Brandt ........................ 439/404 |
| 5,276,817 A | | 1/1994 | Matschke et al. |
| 5,403,202 A | * | 4/1995 | Roehling .................... 439/493 |
| 5,599,595 A | * | 2/1997 | McGinley et al. ............ 428/33 |
| 6,394,833 B1 | * | 5/2002 | Bulmer et al. ............. 439/393 |
| 6,755,683 B1 | * | 6/2004 | Roberts et al. ............. 439/496 |

OTHER PUBLICATIONS

Omrom Sales Brochure. Low-Profile FPC Connectors, date unknown.

Jack Lexin. Comparison of Printed Flexible Circuitry and Traditional Cabling. interConnection Technology. Dec. 19, 2004. http://www.flextech.com/compare.htm.
Gina Roos. Flexible Circuit Connectors Offer New Options. EETimes. Nov. 18, 2004. http://www.eetimes.com.
Flexible Circuit PTF and FCC Terminations. Methode website. http://www.methode.com/mdc/091604/2flex.htm. Sep. 16, 2004.

* cited by examiner

*Primary Examiner*—Gary F. Paumen
*Assistant Examiner*—Edwin A. Leon
(74) *Attorney, Agent, or Firm*—Brian M. Kolkowski

(57) ABSTRACT

The present invention is related to a flexible circuit connector as well as a system using the connector. The present invention further includes an electrical case comprising part of the flexible circuit connection system. Various embodiments of each the flexible circuit connector, flexible circuit system and electrical packaging integrated with the flexible circuit system of the present invention are possible. The flexible circuit connector of the present invention takes advantage of the stiffness of the flexible circuit to bias the circuit against leads in the connector. The flexible circuit connector can also be designed to provide for polarization (or only one means) to connect to the connector. In particular embodiments the connector can be designed into a circuit board, an electrical case or housing or into other types of connectors. The flexible circuit itself can be designed to allow for varying stiffness across the width of the flexible circuit to allow for numerous improvements including better contacts, greater fatigue resistance and improved user characteristics.

13 Claims, 7 Drawing Sheets

LOW PROFILE ELECTRO-MECHANICAL CONNECTOR

The U.S. Government has a paid-up license in this invention and the right in limited circumstances to require the patent owner to license others on reasonable terms provided for by the terms of grant number 2R44HL65024-02 awarded by the National Institutes of Health—National Heart, Lung and Blood Institute.

BACKGROUND OF THE INVENTION

1. Field of the Invention

The present invention is related to a flexible circuit connector as well as a system using the connector. The present invention further includes an electrical case with a built in connector housing comprising part of the flexible circuit connection system.

2. Technical Background

Flexible printed circuitry was originally designed as a replacement for traditional cabling in point to point interconnects. It offers the advantages of increased reliability, greater impedance control, weight and space savings, and a reduction in mechanical connectors or interconnects. Today, in addition to being an effective interconnect, flexible circuits have evolved into an assembly medium for analog and digital devices that can include combinations of multilayer flexible and rigid circuitry.

Various types of mechanical connectors have been developed to connect these flexible circuits to printed circuit boards, cables, other flexible connectors, and/or I/O connectors. While the configurations of these connectors may vary, they generally mechanically connect to the flexible circuit to provide some sort of stress relief on the electrical connection and have a separate contact or connection with each of the printed electrical pathways on the flexible circuit. An example of a contact is where pins in the connector are lined up with, and biased in some way against each of the printed electrical pathways on the flexible circuit. An example of a connection is where a lead in the connector is soldered to the printed electrical pathway of the flexible circuit.

These connectors for flexible circuits still have numerous drawbacks. Over time, connectors with soldered connections tend to fail for various reasons. Time, vibration and other movement cause a wearing of electrical pathways and ultimately signal degradation in connectors with pins which are biased to maintain contact with the printed electrical pathways on the flexible circuit. Most of these types of connectors have a high profile making application in small devices difficult if not impossible.

A small, low profile flexible circuit connector is needed to overcome the abovementioned shortcomings of flexible circuit connectors. It is an object of this invention to provide such a connector. It is a further object of this invention to provide a connector wherein the means for mechanically making the connection also provides the biasing of the electrical pathways against the leads of the connector. It is still a further object of this invention to provide a two-piece connector wherein the flexible circuit itself is the second portion of the connector. Finally, it is an object of this invention to create a connector with various design features which reduce the cost and improve the ease of using the connector while increasing its performance.

SUMMARY OF THE INVENTION

The present invention is related to a flexible circuit connector as well as a system of using the connector. The present invention further includes an electrical case comprising part of the flexible circuit connection system.

Various embodiments of each the flexible circuit connector, flexible circuit system and electrical packaging integrated with the flexible circuit system of the present invention are possible. The flexible circuit connector of the present invention takes advantage of the stiffness of the flexible circuit to bias the circuit against leads in the connector. The flexible circuit connector can also be designed to provide for polarization (or only one means) to connect to the connector. In particular embodiments the connector can be designed into a circuit board, an electrical case or housing or into other types of connectors. The flexible circuit itself can be designed to allow for varying stiffness across the width of the flexible circuit to allow for numerous improvements including better contacts, greater fatigue resistance and improved user characteristics.

In one embodiment, the present invention includes an electrical case and flexible circuit connection system comprising a connector comprising a female mechanical housing of the connector and a male mechanical housing of the connector; an electrical case comprising a cavity for holding electronic components, at least one electrical connector lead and the female mechanical housing of the connector; and a flexible circuit with a top and a bottom surface comprising a flexible base material with a top and a bottom surface and at least one flexible electrical pathway(s) on either the top or bottom surface of the base material; wherein an area of the flexible circuit functions as the male mechanical housing and is held by the female mechanical housing of the connector, at least part of the top surface of the area of the flexible circuit held by the female mechanical housing of the connector is in tension, at least part of the bottom surface of the area of the flexible circuit held by the female mechanical housing of the connector is in compression, and the at least one flexible electrical pathway is in electrical contact with one of the at least one electrical lead(s).

In another embodiment, the present invention includes a flexible circuit connection system comprising a connector comprising a female mechanical housing of the connector and a male mechanical housing of the connector, the female mechanical housing of the connector comprising at least one electrical lead; and a flexible circuit with a top and bottom surface comprising a flexible base material with a top and a bottom surface and at least one flexible electrical pathway(s) on either the top or bottom surface of the base material, the flexible circuit having an area which functions as the male mechanical housing; wherein when the area of the flexible circuit which functions as the male mechanical housing of the connector is held by the female mechanical housing of the connector, at least part of the top surface of the area of the flexible circuit held by the female mechanical housing of the connector is in tension, at least part of the bottom surface of the area of the flexible circuit held by the female mechanical housing of the connector is in compression, and the at least one flexible electrical pathway is in electrical contact with one of the at least one electrical lead.

In still another embodiment, the present invention includes a female housing for a connector for connecting a flexible circuit comprising two edges having a distance between the edges each for holding an edge of a flexible circuit having a width in a connection area, and a backing between the two edges comprising at least one electrical lead wherein the distance between the two edges is shorter than the width of the flexible circuit in the area of connection.

In still another embodiment, the present invention includes an electrical case and flexible circuit connection system comprising a connector comprising a female mechanical housing of the connector and a male mechanical housing of the connector; an electrical case comprising a cavity for holding electronic components, at least one electrical connector lead and the female mechanical housing of the connector; and a flexible circuit with a top and a bottom surface comprising a flexible base material with a top and a bottom surface and at least one flexible electrical pathways on either the top or bottom surface of the base material; wherein an area of the flexible circuit functions as the male mechanical housing and is held by the female mechanical housing of the connector, and the flexible circuit functions both as the male mechanical housing of the connector and as the bias to hold the at least one electrical pathway in contact with the at least one electrical lead.

In still another embodiment the present invention includes a flexible circuit connection system comprising a connector comprising a female mechanical housing of the connector and a male mechanical housing of the connector, the female mechanical housing of the connector comprising at least one electrical lead; and a flexible circuit with a top and bottom surface comprising a flexible base material with a top and a bottom surface and at least one flexible electrical pathways on either the top or bottom surface of the base material, the flexible circuit having an area which functions as the male mechanical housing; wherein the flexible circuit functions both as the male mechanical housing of the connector and as the bias to hold the at least one electrical pathway in contact with the at least one electrical lead.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DESCRIPTION OF THE PREFERRED EMBODIMENT

Figure 1:
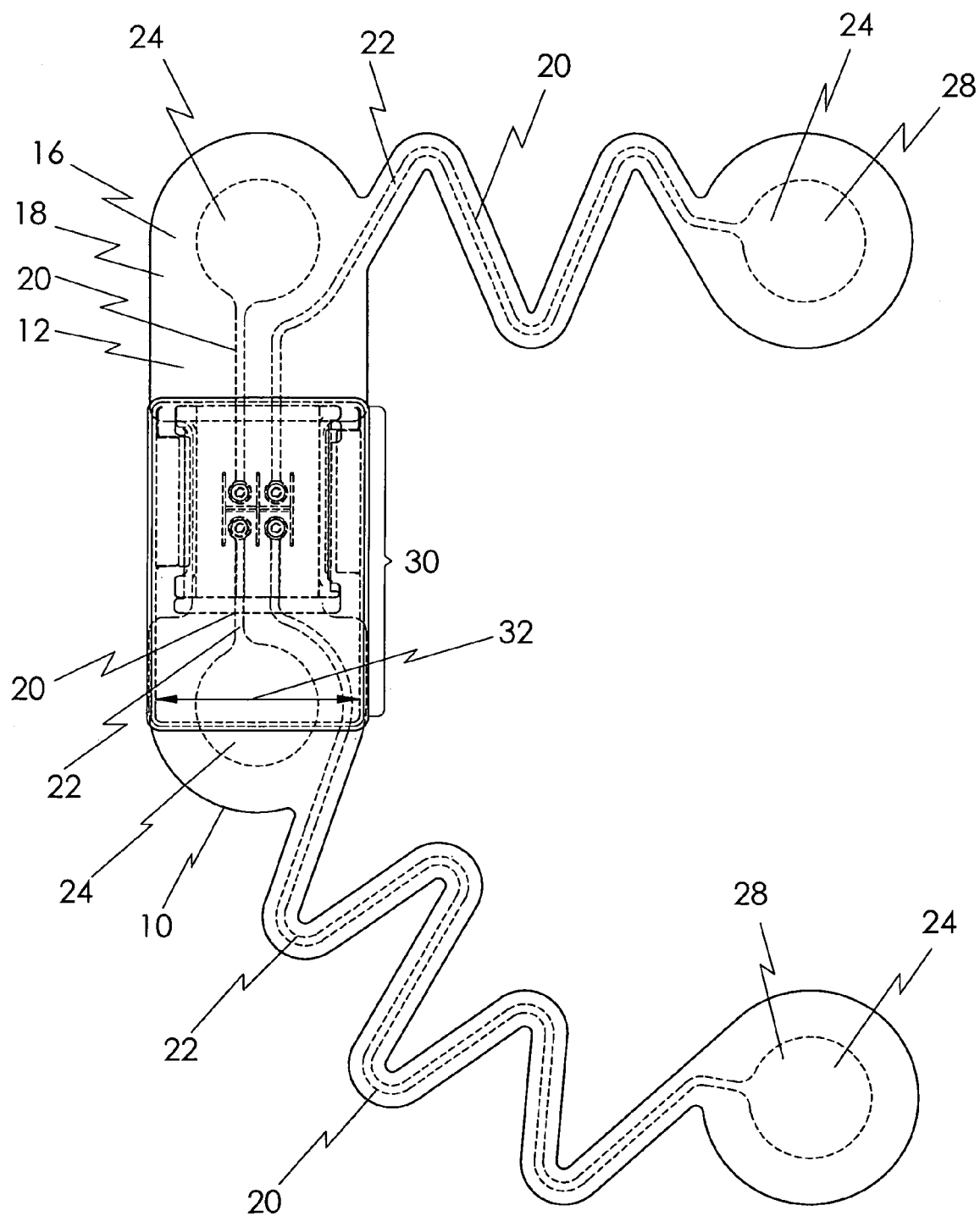
FIG. 1. Planar view of the male mechanical housing of a connection system incorporated into a cardiac patch.

The present invention is related to a flexible circuit connector as well as a system using the connector. The present invention further includes an electrical case comprising part of the flexible circuit connection system. Various embodiments of each the flexible circuit connector, flexible circuit system and electrical packaging integrated with the flexible circuit system of the present invention are possible. The flexible circuit connector of the present invention takes advantage of the stiffness of the flexible circuit to bias the circuit against leads in the connector. The flexible circuit connector can also be designed to provide for polarization (or only one means) to connect to the connector. In particular embodiments the connector can be designed into a circuit board, an electrical case or housing or into other types of connectors. The flexible circuit itself can be designed to allow for varying stiffness across the width of the flexible circuit to allow for numerous improvements including better contacts, greater fatigue resistance and improved user characteristics.

The connector of the present invention comprises a female mechanical housing at least one lead and possibly other features and a male mechanical housing, which is formed from the flexible circuit. The flexible circuit of the present invention preferably offers the advantages of increased reliability, greater impedance control, weight and space savings, and/or a reduction in mechanical connectors. The flexible circuit of various embodiments of the present invention is at least one electrode pathway or conductor bonded to a thin flexible film or base material. The flexible circuits are made with a variety of materials and techniques suitable for different applications and can be single-layer, single-sided; single-layer, double-sided; or multi-layer. Preferably, the flexible film or base material is a polymer film, and more preferably a dielectric polymer film. Examples of films which can be used for the base material include but are not limited to polycarbonate, polyester, fiberglass and polyamide. The flexible circuitry of the present invention is an array of conductors bonded to a thin, preferably dielectric film. The electrode pathway(s) or conductor(s) of the flexible circuit are preferably printed onto the base material or incorporated by some other means know to those skilled in the art.

Preferably, the flexible circuit comprises at least two electrical pathways, more preferably at least four electrical pathways, and most preferably at least six electrical pathways. Preferably, the thickness of the base material is from about 0.2 to about 0.4 mm, more preferably from about 0.3 to about 0.5 mm, and most preferably from about 0.5 to about 0.8 mm. Preferably, the width of the at least one conductor or electrical pathway is from about 0.25 to about 0.3 mm, more preferably from about 0.3 to about 0.5 mm, and most preferably from about 0.5 to about 1.0 mm. Preferably, the thickness of the at least one conductor or electrical pathway is from about 0.05 to about 0.1 mm, more preferably from about 0.1 to about 0.15 mm, and most preferably from about 0.15 to about 0.25 mm. If two or more electrical pathways are used preferably, the spacing or nearest distance between the edge of the electrical pathways is from about 0.25 to about 1.0 mm, more preferably from about 1.0 to about 2.0 mm, and most preferably from about 2.0 to about 4.0 mm.

The flexible printed circuits of the present invention can be made with a variety of materials and techniques suitable for different applications. The flexible printed circuits that may include single-layer or multi-layer configurations. Among the considerations are the degree of flexibility, costs, solderability, and fatigue characteristics. Circuit density can be increased by adding layers to the flexible circuit and by also decreasing the line widths and spacings. These configurations include single-sided flexible circuits consist of a single conductive layer and are the simplest type of flexible circuit. Single-sided circuits are preferably used for dynamic flexing applications such as printer and disk drive drive heads. Double-sided flexible circuits, are circuits with two conductive layers that are usually accessible from both sides. Multi-layer circuits, are circuits with more than two layers. Interconnection between layers is usually through means of plated-through holes. Double-sided and multi-layer circuits are used where there is a need for increased circuit density and there is limited dynamic flexing.

Flexible circuitry allows for the replacement of individual wires and connectors with one or more integrated circuits. In some applications, mechanical connectors can be eliminated altogether. As an interconnect, the main advantages of flexible circuits over traditional cabling are greater reliability, size and weight reduction, elimination of mechanical connectors, elimination of wiring errors, increased impedance control and signal quality, circuit simplification, greater operating temperature range and higher circuit density. In applications using flexible circuits, the circuit is preferably designed and engineered specifically for the intended application, thus maximizing efficiency in both cost and performance. Mis-wiring errors are virtually eliminated, and, as already noted, the number of mechanical connectors can be reduced or eliminated. The reduction of mechanical connectors results in a cleaner signal path and eliminates circuit failures associated with these connectors. With processor speeds approaching the multi-gigahertz range and beyond, signal degradation and impedance control are becoming central issues in the electronics and computer industry.

FIG. 1 is a planar view of the male mechanical housing of a flexible connection system incorporated into a cardiac patch. The cardiac patch is a patch which is used to perform an EKG diagnosis. The cardiac patch is one of many applications for the flexible connection system of the present invention. In FIG. 1, a flexible circuit 10 with top 12 and bottom (not shown) surfaces is formed from a laminate material 16. The laminate material comprises a base material 18 with at least one electrical pathway 20 formed on the base material 18, and a dielectric coating material (not shown) applied over the conductive coating layer 22 containing the at least one electrical pathway 20. In this particular embodiment of the flexible circuit 10, there are four electrical pathways 20 on the top surface 12 of the base material leading to medical electrodes 24. The laminate material 16 further comprises a foam backing (not shown) and wells or cavities 28 for holding an electrically conductive gel (not shown). The flexible circuit 10 comprises an area 30, which functions as the male mechanical housing. This area 30 has a width 32, which preferably is greater than the distance between the edges of the female housing (not shown), which are used to form the mechanical connection with the flexible circuit 10.

The male mechanical housing of the connector for various embodiments of the present invention is formed in an area of the flexible circuit intended for connection. Depending on the application, e.g., medical, mobile or cell phone, computer, printer, etc., this area of the flexible circuit is configured for the application. This area of the flexible circuit is the area that is held by the female mechanical housing of the connector. This area of the flexible circuit, preferably, functions as both the male mechanical housing of the connector and to provide bias to hold the at least one or more electrical pathway(s) of the flexible circuit in contact with the at least one or more electrical leads of the female mechanical housing of the connector. Also preferably, at least part of one of the surfaces of the flexible circuit is in tension and the opposite surface is in compression.

Figure 2A:
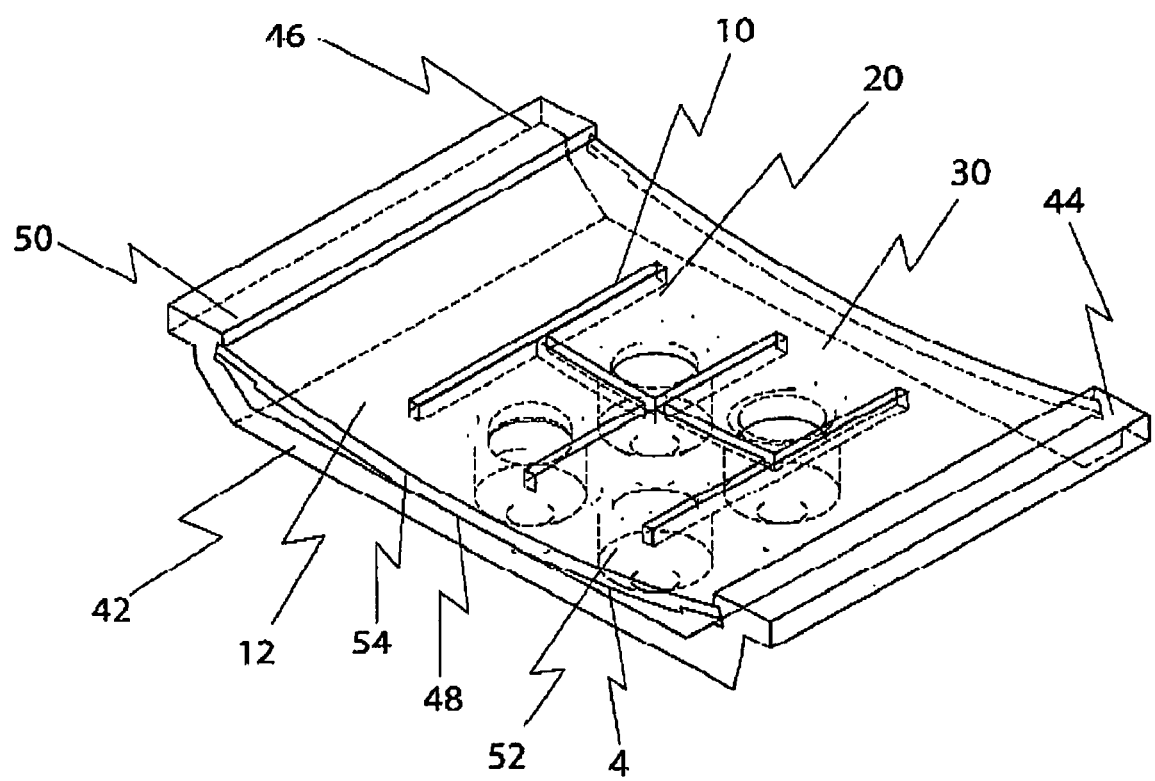
FIG. 2. A) Perspective view of a connected, flexible circuit connection system; and B) Exploded view of unconnected, flexible circuit connection system.
Figure 2B:
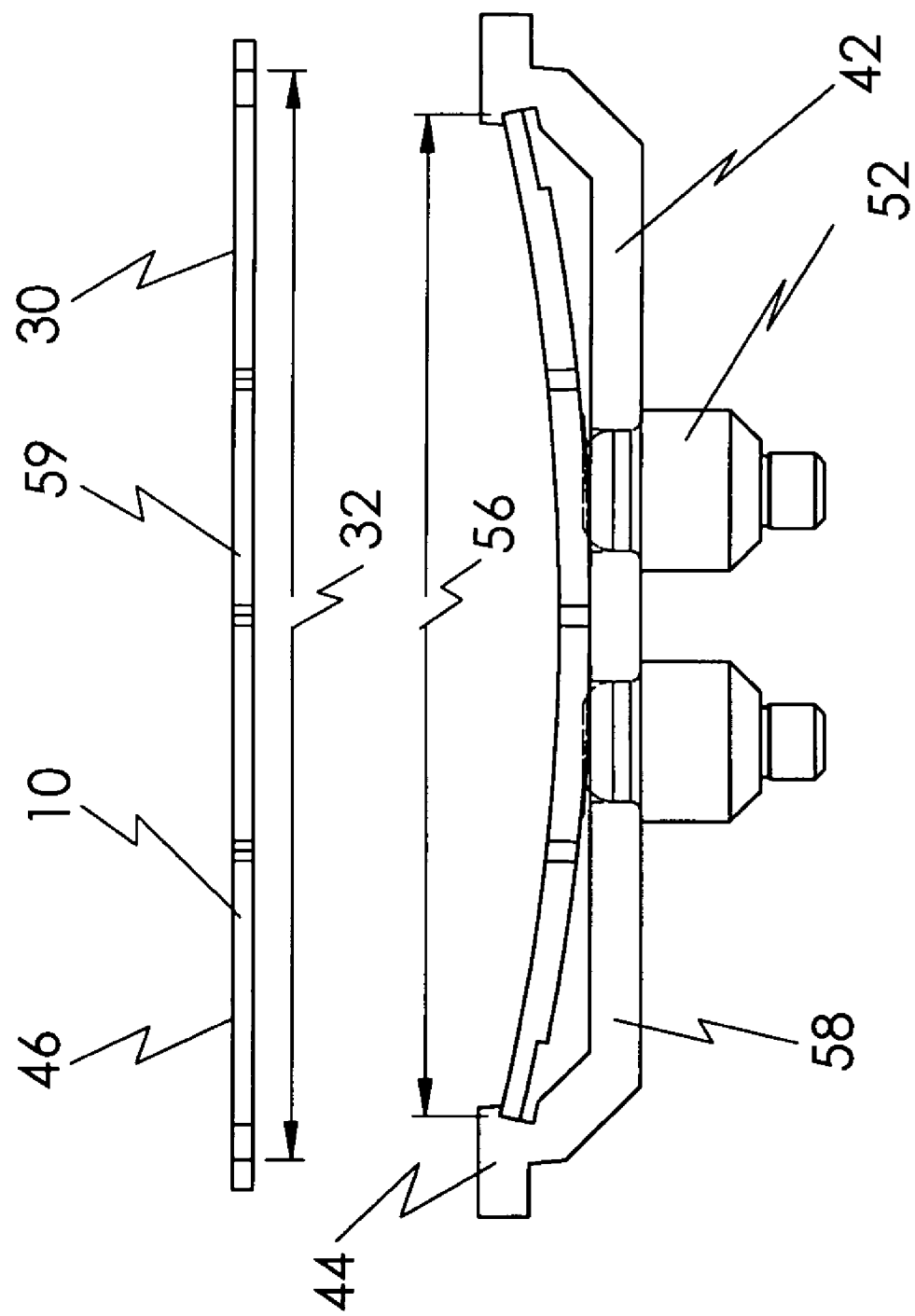

FIG. 2A) is a perspective view of a connected, flexible circuit connection system; and B) is an exploded view of an unconnected, flexible circuit connections system. In FIG. 2A), the flexible circuit connection system 40 comprises a mechanical male housing area 30, and a female housing 42. The female housing 42 comprising two edges or channels 44 for holding the edges 46 of the mechanical male housing area 30. The area 30 of the flexible circuit preferably functions both as the male mechanical housing 30 of the connector 50 and as the bias to hold the at least one electrical pathway 20 in contact with the at least one electrical lead 52. More preferably, the top surface 12 of the flexible circuit 10 in the mechanical male housing area 30 being at least part in tension 48 and at least part of the bottom surface 14 of the flexible circuit 10 in the male mechanical housing area 30 being at least part in compression 54. In FIG. 2B), the unconnected, flexible circuit connection system 40 comprises the female housing 42 and an area 30 of the flexible circuit 10 which functions as the male mechanical housing. The female housing 42 having two edges or channels 44 having a distance 56 between the two edges or channels 44. The female housing 42 also having a backing 58 between the two edges or channels 44. The backing 58 can be integral with or connected to the two edges or channels 44. The backing 58 comprising at least one electrical lead 52, and in this case four electrical leads 52. The area 30, which functions as the male mechanical housing has a width 32, which is greater than the distance 56 between the two edges or channels 44 of the female housing 42. In other words, the distance between the two edges or channels 44 of the female mechanical housing 42 is shorter than the width 32 of the flexible circuit 10 in this area 30. Preferably, the width 32 of the area 30 of the flexible circuit which functions as the male mechanical housing has stiffness that varies over the width 32. More preferably, this area is stiffer in the center 59 of the area 30 and less stiff at the edges 46 of this area 30.

Figure 3A:
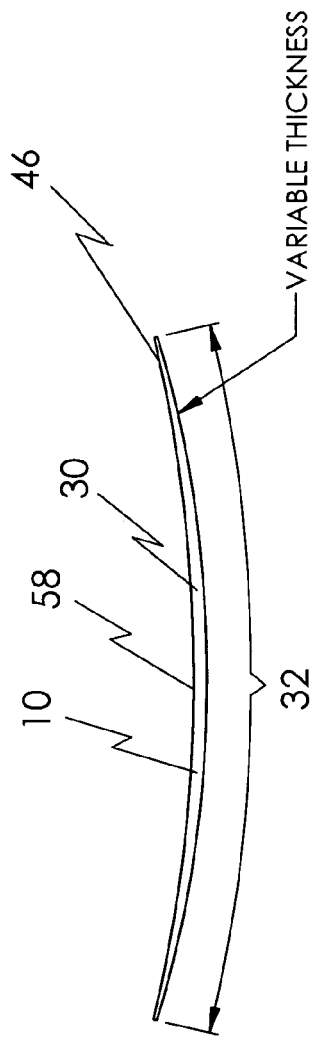
FIG. 3. Cross-sectional views of an area of the flexible circuit functioning as the male mechanical housing showing stiffness that varies across the width of the area by A) varying thickness, B) material variations, and C) varying the structural configuration of the area.
Figure 3B:
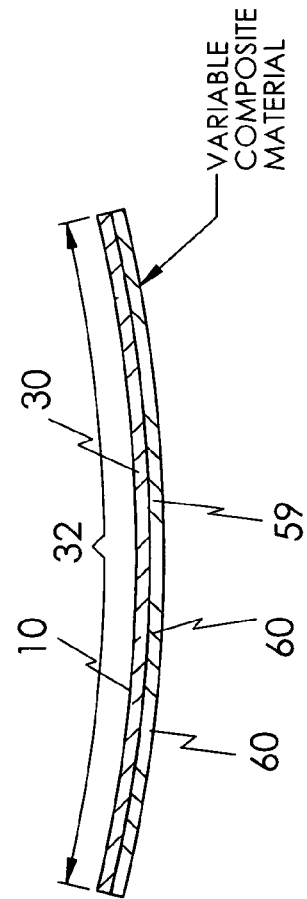
Figure 3C:
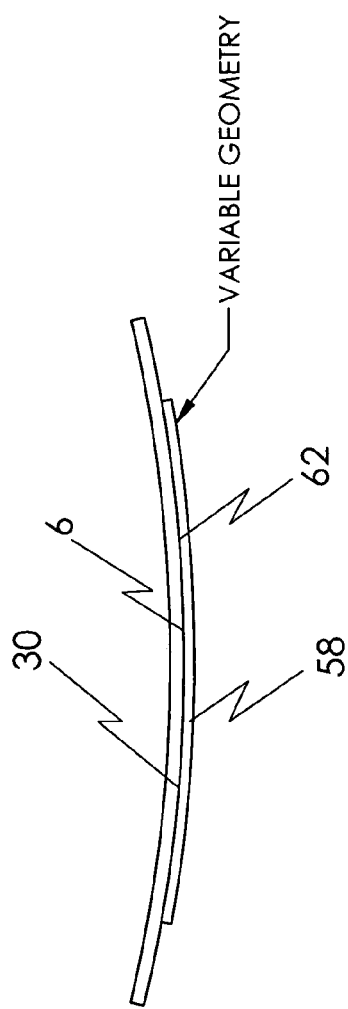

In order to provide tensile and compressive forces on the opposite surfaces of the flexible circuit, preferably the circuit is bent in this area of contact. By varying the stiffness of the flexible circuit in this area, the connection can be designed so that the degree of bias of the connector and the surface area in contact between the electrical pathways and electrical leads can be optimized to provide the desired mechanical and electrical connector properties. A number of techniques can be used to vary the stiffness over the area of the flexible circuit used as the male connector housing. These include changing the thickness across the width of the base material used in this area, varying the composition across the width of the base material used in this area and by adding stiffening layers in various regions across the flexible circuit in this area. FIG. 3 shows three cross-sectional views of different embodiments of the area of the flexible circuit that functions as the male mechanical housing. FIG. 3A) shows a cross-sectional view of the flexible circuit 10 in this area 30 with varying thickness across the width 32. The thickness of the flexible circuit 10 is less at the edges 46 than in the center 58. FIG. 3B) shows a cross-sectional view of the flexible circuit 10 in this area 30 with material variations 60 across the width 32. Preferably, the material is stiffer in the center 59 than along the edges 46. FIG. 3C) shows a cross-sectional view of the flexible circuit 10 in this area 30 where the structure is varied across this area. In this particular embodiment an additional sheet 62 of material is laminated to the flexible circuit 10 in this area 30 to stiffen the center 58 of this area 30.

The female mechanical housing of the connector preferably has two channels or edges for holding the edges of flexible circuit in the area functioning as the male mechanical housing. The female mechanical housing still preferably has a backing between the two edges comprising at least one electrical lead. Still more preferably, the backing connects the two edges of the female mechanical housing. The channels or edges of the female mechanical housing have a width or distance between them, which is shorter than the width of the flexible circuit in the area of connection. The flexible circuit in the area of connection is snapped or pressed into the female mechanical housing, and in doing so the flexible circuit is held in place with a reasonable force while biasing the at least one electrical pathway of the flexible circuit against the at least one electrical lead of the backing of the female housing for the connector.

Figure 4:
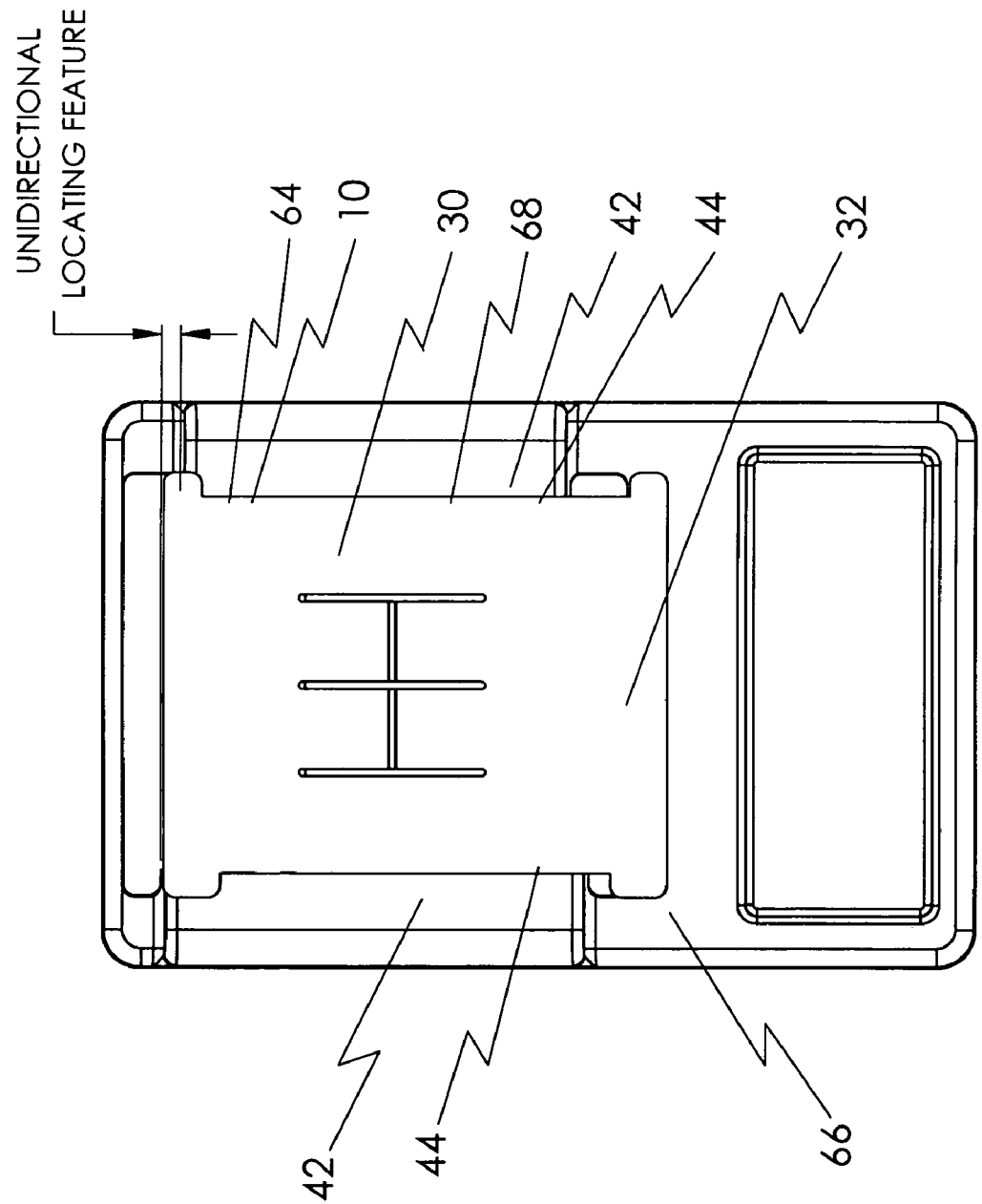
FIG. 4. Planar view of mechanical housing of a connection system with unidirectional locating feature.

Preferably, the channels or edges are shaped or formed in such a way to allow only one way for the flexible circuit to connect to the connector. Still preferably, the width of the flexible circuit at least at some point is greater than the distance between the edges of the female housing of the connector. This will cause the flexible circuit to bend and create the mechanical connection. In bending the flexible circuit, preferably, at least part of one surface of the flexible circuit is in tension and the opposite surface is in compression. Preferably, the flexible circuit in the area used as a male mechanical connector is shaped or cut to allow only one way for the female mechanical housing of the connector to connect to this area of the flexible circuit. This helps to prevent user error when assembling or hooking up the connector. FIG. 4 shows a planar view of a mechanical housing of connections systems with an unidirectional locating feature. In FIG. 4, there is shown one embodiment of the unidirectional locating feature of the present invention. In FIG. 4, the area 30 of the flexible circuit 10 which functions as the male mechanical housing is connected to the female housing 42. Both the female housing 42 and area 30 of the flexible circuit 10 have a unidirectional locating feature 64. In this particular embodiment the unidirectional locating feature is a key-hole feature 64, where the channel or edge 44 of the female housing 42 of the connector is shorter on one edge 68. This same feature is designed into the area 30 of the flexible circuit 10. In the particular embodiment shown in this drawing the female housing 42 is integral to or incorporated into a electrical case 66 for holding electronic components (not shown).

Figure 5:
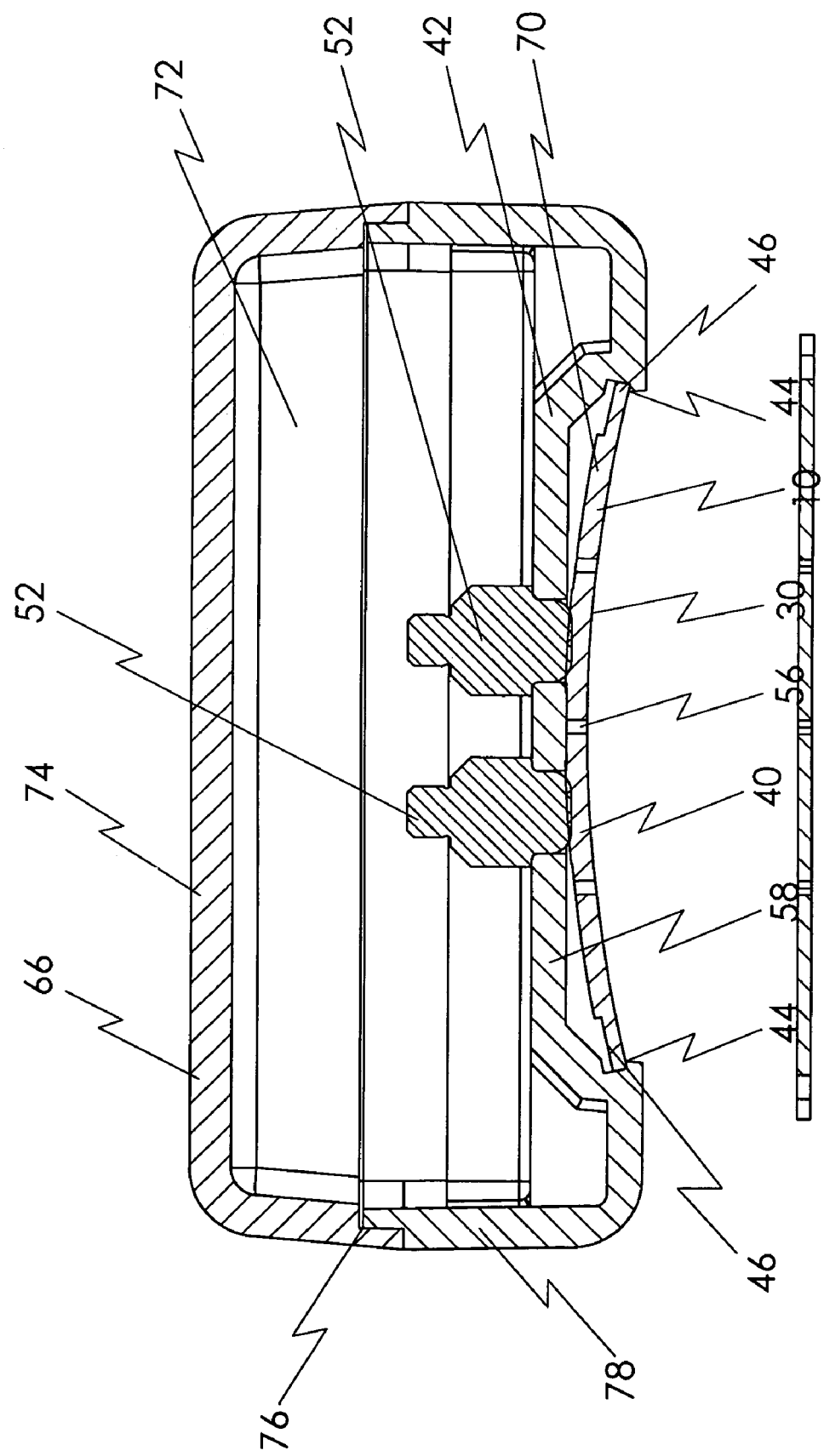
FIG. 5. Cross-sectional view of an electrical case and a flexible circuit connection system.
Figure 6:
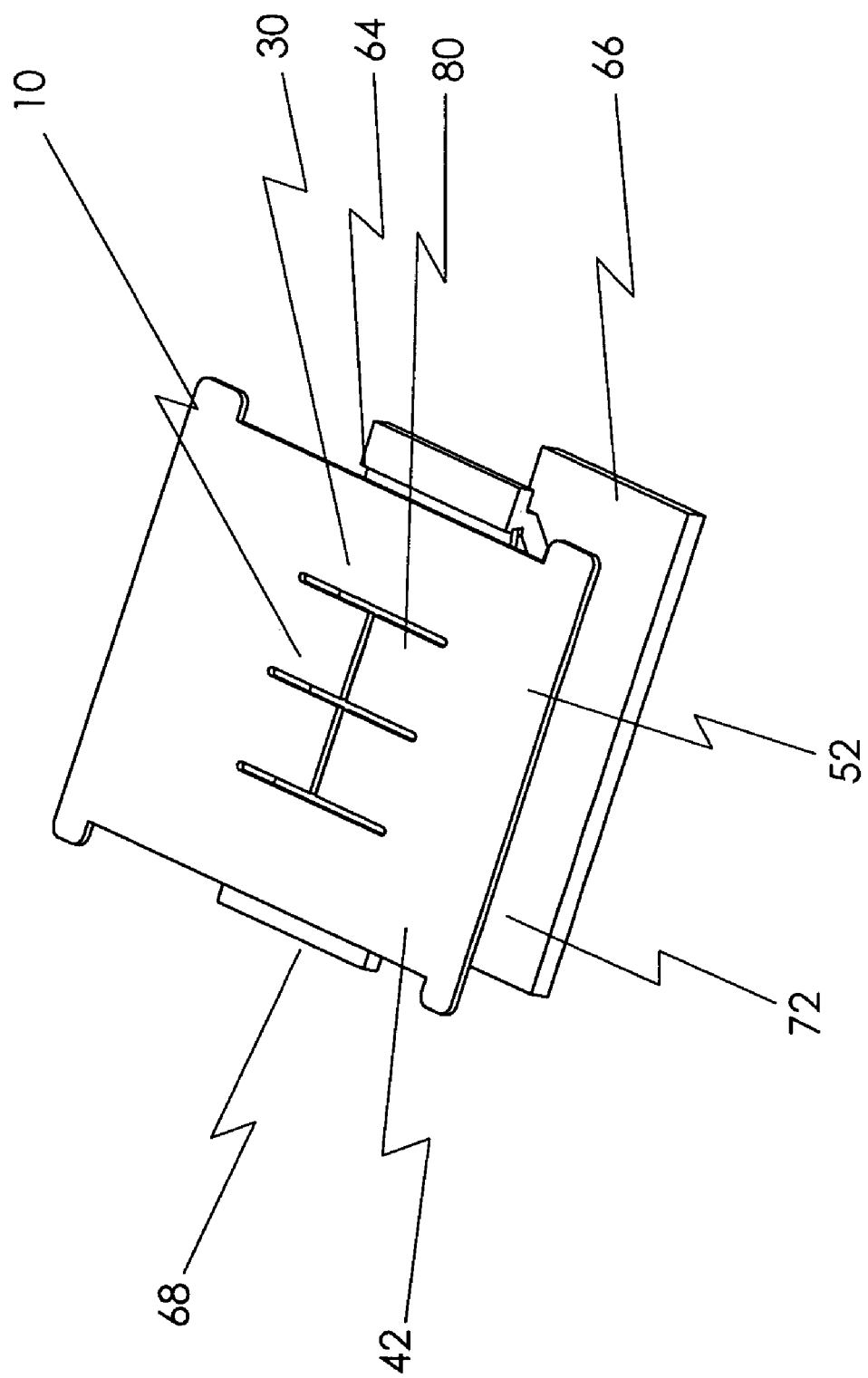
FIG. 6. Cut away from a perspective view of an electrical case and a flexible circuit connection system.

The female housing of the connector preferably is formed by drawing or forming a material to be used for the housing. Preferably, the female housing is one piece except for the electrical leads, which are placed through the back of the housing. More preferably, the housing is formed from a plastic or polymer resin or sheet material by molding or thermoforming the plastic or polymer. Even more preferably, the female housing is attached to or incorporated into an electrical case for holding electrical or electronic components. The electrical case having a cavity for holding these components and where the electrical leads pass through the backing of the housing to connect some or all of the electronic components to the flexible circuit. The electrical components can be parts of a computer, wireless telemetry devices, printers and their components, wireless telephones and the like. FIG. 5 is a cross-sectional view of an electrical case and a flexible circuit connection system. In FIG. 5, a flexible circuit connection system 40 is incorporated into an electrical case 66 for holding electronic components (not shown). The electrical case 66 has a cavity 72 for holding the electronic components (not shown) and to which the electrical lead(s) 52 are attached or connected. The electrical case 66 further has a cover 74, which in this embodiment makes a snap mechanical connection 76 to the lower body 78 of the case 66. In this particular embodiment, the backing 58 is molded into the lower body 78 of the case 66. When the area 30 of the flexible circuit 10 is connected to the female housing 42 of the connector, the edges 46 of this area 30 are held by the edges or channels 44 of the female housing 42. Further, when connected the electrical pathways (not shown) of the area 30 of the flexible circuit are biased against the electrical lead(s) 52 of the female housing 42. FIG. 6 is a cut away from a perspective view of an electrical case with a flexible circuit connection system. In FIG. 6, electrical case 66 comprises a cavity 72. The female housing 42 which in this embodiment is molded into the electrical case 66 also has the unidirectional location feature or key hole 64 built into the housing with a shorter edge 68 to be held by the channels 44. The area 30 of the flexible circuit 10 further includes a leveling and/or bias adjustment feature 80 for leveling and/or adjusting the bias of the electrical pathway(s) (not shown) in contact with the electrical leads 52.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An electrical case and flexible circuit connection system comprising a connector comprising a female mechanical housing of the connector, the female mechanical housing comprising two edges or channels having a distance between the edges or channels;

an electrical case comprising a cavity for holding electronic components, at least one electrical connector lead and the female mechanical housing of the connector; and a flexible circuit with two edges, and a top and a bottom surface comprising a flexible base material with a top and a bottom surface and at least one flexible electrical pathways on either the top or bottom surface of the base material;

wherein an area of the flexible circuit, having a width between the two flexible circuit edges, functions as a male mechanical housing and is held by the female mechanical housing of the connector, the flexible circuit functions both as the male mechanical housing of the connector and as a bias to hold the at least one electrical pathway in contact with the at least one electrical lead, and the distance between the two edges or channels of the female mechanical housing is shorter than the width between the two flexible circuit edges in the area.

2. The electrical case and flexible circuit connection system in claim 1, wherein the female mechanical housing of the connector is molded into the electrical case.

3. The electrical case and flexible circuit connection system in claim 1, wherein the area of the flexible circuit which functions as the male mechanical housing has edges, the edges in the area which are cut to allow only one way for the female mechanical housing of the connector to connect to the area of the flexible circuit which functions as the male mechanical housing of the connector.

4. The electrical case and flexible circuit connection system in claim 1, wherein at least part of the top surface of the area of the flexible circuit held by the female mechanical housing of the connector is in tension, at least part of the bottom surface of the area of the flexible circuit held by the female mechanical housing of the connector is in compression, and the at least one flexible electrical pathway is in electrical contact with one of the at least one electrical lead.

5. The electrical case and flexible circuit connection system in claim 1, wherein the area of the flexible circuit which functions as the male mechanical housing has a width and wherein the width has a stiffness that varies over the width.

6. The electrical case and flexible circuit connection system in claim 5, wherein the stiffness varies over the width in part due to changes in thickness across the width.

7. A flexible circuit connection system comprising
a connector comprising a female mechanical housing of the connector, the female mechanical housing of the connector comprising at least one electrical lead and two edges or channels having a distance between the edges or channels; and
a flexible circuit with two edges, and a top and bottom surface comprising a flexible base material with a top and a bottom surface and at least one flexible electrical pathways on either the top or bottom surface of the base material, the flexible circuit having an area having a width between the two flexible circuit edges, which functions as a male mechanical housing;
wherein the flexible circuit functions both as the male mechanical housing of the connector and as a bias to hold the at least one electrical pathway in contact with the at least one electrical lead, and the distance between the two edges or channels of the female mechanical housing is shorter than the width between the two flexible circuit edges in the area.

8. The flexible circuit connection system in claim 7, wherein the area of the flexible circuit which functions as the male mechanical housing has edges, the edges in the area which are cut to allow only one way for the female mechanical housing of the connector to connect to the area of the flexible circuit which functions as the male mechanical housing of the connector.

9. The flexible circuit connection system in claim 7, wherein when the area of the flexible circuit which functions as the male mechanical housing of the connector is held by the female mechanical housing of the connector, at least part of the top surface of the area of the flexible circuit held by the female mechanical housing of the connector is in tension, at least part of the bottom surface of the area of the flexible circuit held by the female mechanical housing of the connector is in compression, and the at least one flexible electrical pathway is in electrical contact with one of the at least one electrical lead.

10. The flexible circuit connection system in claim 7, wherein the female mechanical housing of the connector further comprises two edges having a distance between the edges for holding an edge of the area of the flexible circuit which functions as the male mechanical housing of the connector, and a backing between the two edges of the female mechanical housing, the backing comprising the at least one electrical lead.

11. The flexible circuit connection system in claim 7, wherein the area of the flexible circuit which functions as the male mechanical housing has a width and wherein the width has a stiffness that varies over the width.

12. The flexible circuit connection system in claim 11, wherein the stiffness varies over the width in part due to changes in thickness across the width.

13. The flexible circuit connection system in claim 11, wherein the stiffness varies over the width in part due to changes in composition across the width of the base material.

* * * * *